US012709798B2

(12) United States Patent
Nishida et al.

(10) Patent No.: US 12,709,798 B2
(45) Date of Patent: Aug. 18, 2026

(54) METHOD OF MANUFACTURING SEMICONDUCTOR DEVICE, METHOD OF MANAGING PARTS, AND RECORDING MEDIUM

(71) Applicant: KOKUSAI ELECTRIC CORPORATION, Tokyo (JP)

(72) Inventors: Masaya Nishida, Toyama (JP); Nobuhito Shima, Toyama (JP); Akihiro Sato, Toyama (JP); Yosuke Kuwata, Toyama (JP); Kenichi Maeda, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 687 days.

(21) Appl. No.: 18/072,278

(22) Filed: Nov. 30, 2022

(65) Prior Publication Data

US 2023/0144886 A1 May 11, 2023

Related U.S. Application Data

(63) Continuation of application No. 16/451,507, filed on Jun. 25, 2019, now Pat. No. 11,535,931.

(30) Foreign Application Priority Data

Jun. 26, 2018 (JP) ................................ 2018-121147
May 20, 2019 (JP) ................................ 2019-094748

(51) Int. Cl.
*C23C 16/44* (2006.01)
*C23C 16/34* (2006.01)
(Continued)

(52) U.S. Cl.
CPC ........ *C23C 16/4408* (2013.01); *C23C 16/345* (2013.01); *C23C 16/52* (2013.01);
(Continued)

(58) Field of Classification Search
CPC ........ C23C 16/45561; C23C 16/45544; C23C 16/4408; C23C 16/52; G05D 7/0635; H10P 74/20
See application file for complete search history.

(56) References Cited

U.S. PATENT DOCUMENTS 9,508,555 B2 11/2016 Kaga et al.
9,704,703 B2 7/2017 Hashimoto et al.
(Continued)

FOREIGN PATENT DOCUMENTS

CN 101496144 A 7/2009
CN 108071853 A 5/2018
(Continued)

OTHER PUBLICATIONS

Chinese Office Action issued on Nov. 24, 2022 for Chinese Patent Application No. 201910554484.7.
(Continued)

*Primary Examiner* — Joseph A Miller, Jr.
(74) *Attorney, Agent, or Firm* — Volpe Koenig

(57) ABSTRACT

There is provided a technique that includes executing a process recipe for processing a substrate; and executing a correction recipe for checking a characteristic value of a supply valve installed at a process gas supply line, wherein the act of executing the correction recipe comprises: supplying an inert gas into the process gas supply line for a certain period of time in a state where an adjusting valve that is installed at an exhaust portion of a process furnace and adjusts an internal pressure of the process furnace is fully opened; detecting a pressure value in a supply pipe provided with the supply valve while supplying the inert gas into the process gas supply line in the state where the adjusting valve is fully opened; and calculating the characteristic value of the supply valve based on the detected pressure value.

19 Claims, 9 Drawing Sheets

| No. | Step | Contents |
|---|---|---|
| 1 | Start | ·The internal temperature of process chamber (2) is set to temperature in normal standby state<br>·N2 purge with valves (55, 81(AV1), 82(AV2), 52(AV3), 67) opened |
| 2 | Boat loading | ·Boat (32) is loaded into process chamber (2) (for evacuating process chamber (2)) |
| 3 | Evacuation (vacuum) | ·Evacuating process chamber (2) with valves (81(AV1). 82(AV2), 52(AV3), 84(AV4) closed |
| 4 | Purge | ·N2 purge with valves (81(AV1), 82(AV2). 52(AV3), 84(AV4), 67) opened |
| 5 | Cv value calculation Appropriate determination (check) | ·N2 gas is flown into process chamber (2) with valves (81(AV1). 82(AV2), 52(AV3), 84(AV4), 67) opened (with valve (67) fully opened)<br>·Cv value is calculated from output value of pressure gauge (80)<br>·The calculated Cv value is compared with reference value (reference range) to determine (check) whether or not it is appropriate |
| 6 | Return to atmospheric pressure | ·The internal pressure of process chamber (2) is returned to the atmospheric pressure |
| 7 | Boat unloading | ·Boat (32) is unloaded from process chamber (2) |
| 8 | End | ·Return to normal standby state |

(51) Int. Cl.

| | |
|---|---|
| ***C23C 16/52*** | (2006.01) |
| ***H10P 14/60*** | (2026.01) |
| ***H10P 14/694*** | (2026.01) |
| ***H10P 74/20*** | (2026.01) |

(52) U.S. Cl.

CPC .... *H10P 14/6339* (2026.01); *H10P 14/69433* (2026.01); *H10P 74/20* (2026.01)

(56) References Cited

U.S. PATENT DOCUMENTS

| | | | | |
|---|---|---|---|---|
| 10,211,110 | B1 | 2/2019 | Kamakura et al. | |
| 10,998,210 | B2 | 5/2021 | Saito et al. | |
| 2002/0189545 | A1* | 12/2002 | Matsumura | C23C 16/44 219/390 |
| 2003/0121608 | A1* | 7/2003 | Chen | C23C 16/34 257/E21.171 |
| 2006/0097644 | A1 | 5/2006 | Kono et al. | |
| 2007/0158025 | A1 | 7/2007 | Larson | |
| 2008/0191153 | A1 | 8/2008 | Marganski et al. | |
| 2014/0295667 | A1 | 10/2014 | Kaga et al. | |
| 2016/0093476 | A1 | 3/2016 | Toyoda et al. | |
| 2016/0104624 | A1 | 4/2016 | Fu et al. | |
| 2017/0092549 | A1 | 3/2017 | Yagi et al. | |
| 2019/0131155 | A1* | 5/2019 | Bachlechner | H01L 21/67393 |
| 2019/0177849 | A1 | 6/2019 | Mo et al. | |

FOREIGN PATENT DOCUMENTS

| | | | |
|---|---|---|---|
| JP | H0694160 | A | 4/1994 |
| JP | 2009-523321 | A | 6/2009 |
| JP | 2009-252147 | A | 10/2009 |
| JP | 2012-052669 | A | 3/2012 |
| JP | 2013-181877 | A | 9/2013 |
| JP | 2016-072260 | A | 5/2016 |
| KR | 20170038730 | A | 4/2017 |
| WO | 2004/109420 | A | 12/2004 |

OTHER PUBLICATIONS

Korean Office Action issued on Jun. 3, 2020 for the Korean Patent Application No. 10-2019-0075544.

Chinese Office Action issued on Sep. 13, 2023 for Chinese Patent Application No. 201910554484.7.

* cited by examiner

FIG. 5

| No. | Step | Contents |
|---|---|---|
| 1 | Start | ·The internal temperature of process chamber (2) is set to temperature in normal standby state<br><br>·N2 purge with valves (55, 81(AV1), 82(AV2), 52(AV3), 67) opened |
| 2 | Boat loading | ·Boat (32) is loaded into process chamber (2) (for evacuating process chamber (2)) |
| 3 | Evacuation (vacuum) | ·Evacuating process chamber (2) with valves (81(AV1), 82(AV2), 52(AV3), 84(AV4) closed |
| 4 | Purge | ·N2 purge with valves (81(AV1), 82(AV2), 52(AV3), 84(AV4), 67) opened |
| 5 | Cv value calculation Appropriate determination (check) | ·N2 gas is flown into process chamber (2) with valves (81(AV1), 82(AV2), 52(AV3), 84(AV4), 67) opened (with valve (67) fully opened)<br><br>·Cv value is calculated from output value of pressure gauge (80)<br><br>·The calculated Cv value is compared with reference value (reference range) to determine (check) whether or not it is appropriate |
| 6 | Return to atmospheric pressure | ·The internal pressure of process chamber (2) is returned to the atmospheric pressure |
| 7 | Boat unloading | ·Boat (32) is unloaded from process chamber (2) |
| 8 | End | ·Return to normal standby state |

METHOD OF MANUFACTURING SEMICONDUCTOR DEVICE, METHOD OF MANAGING PARTS, AND RECORDING MEDIUM

CROSS-REFERENCE TO RELATED APPLICATIONS

This non-provisional application is a continuation of U.S. patent application Ser. No. 16/451,507, filed Jun. 25, 2019 and claims the benefit of priority from Japanese Patent Application Nos. 2018-121147 and 2019-094748, filed on Jun. 26, 2018 and May 20, 2019, respectively, the entire contents of which are incorporated herein by references.

TECHNICAL FIELD

The present disclosure relates to a method of manufacturing a semiconductor device, a method of manufacturing parts, and a recording medium.

BACKGROUND

There have been developed a substrate processing apparatus for manufacturing a semiconductor device by forming a thin film on a substrate such as a silicon wafer, and a method of manufacturing the semiconductor device.

As one type of this substrate processing apparatus, there is a semiconductor manufacturing apparatus that executes one process of manufacturing a semiconductor device (hereinafter referred to as a substrate-processing process). In a substrate processing apparatus as the semiconductor manufacturing apparatus, for example, a SiN film is formed over a substrate (hereinafter also referred to as a wafer) with a DCS gas and an $NH_3$ gas.

Particularly, in a vertical semiconductor manufacturing apparatus in which a gas is charged into a tank and then blown out, it is known that the film formation result fluctuates depending on a Cv value (a so-called capacity coefficient which is a value indicating the volume of fluid flowing through a valve at a differential pressure across the fluid) of a valve at the subsequent stage (downstream) of the tank, and so a valve whose Cv value is strictly measured may be used. However, the Cv value may fluctuate depending on the number of times of opening/closing of the valve or due to other disturbances such as valve temperature fluctuation, which may affect the film formation result.

Further, even when the valve Cv value in the initial state is the same, the Cv value may fluctuate due to a difference in the device environment, and therefore, matching between the film thickness and uniformity of a plurality of devices may become problematic.

SUMMARY

Some embodiments of the present disclosure provide a technique capable of preventing occurrence of product lot-out due to fluctuation of a valve characteristic value even when the characteristic value fluctuates due to long-term operation or external factors.

According to one or more embodiments of the present disclosure, there is provided a technique that includes executing a process recipe for processing a substrate by supplying a process gas into a process furnace; and executing a correction recipe for checking a characteristic value of a supply valve installed at a process gas supply line for supplying the process gas into the process furnace, wherein the act of executing the correction recipe comprises: supplying an inert gas into the process gas supply line for a certain period of time in a state where an adjusting valve that is installed at an exhaust portion of the process furnace and adjusts an internal pressure of the process furnace is fully opened; detecting a pressure value in a supply pipe provided with the supply valve while supplying the inert gas into the process gas supply line in the state where the adjusting valve is fully opened; and calculating the characteristic value of the supply valve based on the detected pressure value.

BRIEF DESCRIPTION OF DRAWINGS

FIG. 5 is an explanatory view showing an outline of a correction recipe for check of a Cv value according to the present embodiments.

DETAILED DESCRIPTION

Figure 1:
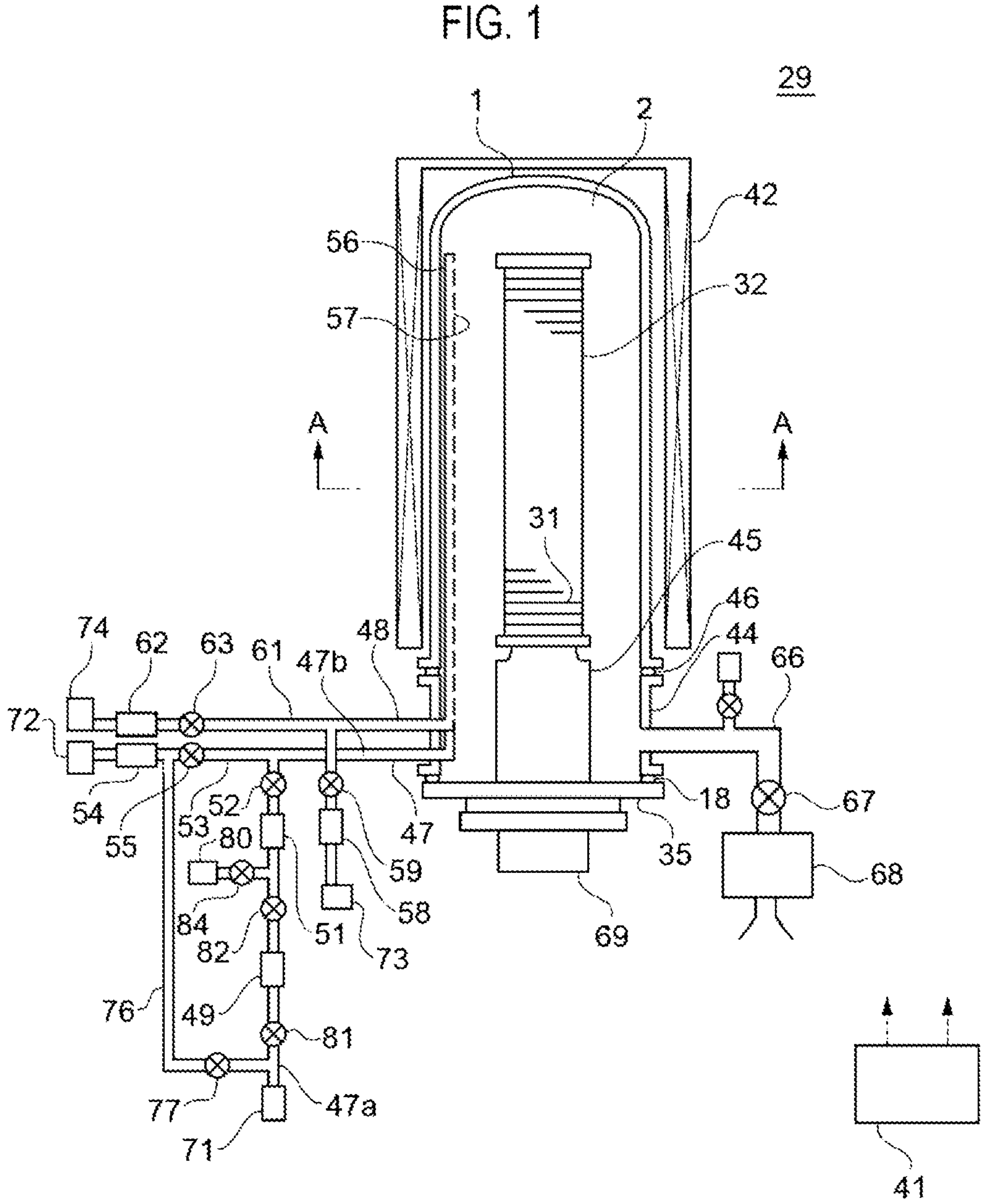
FIG. 1 is a longitudinal sectional view schematically showing a vertical process furnace of a substrate processing apparatus according to embodiments of the present disclosure.
Figure 2:
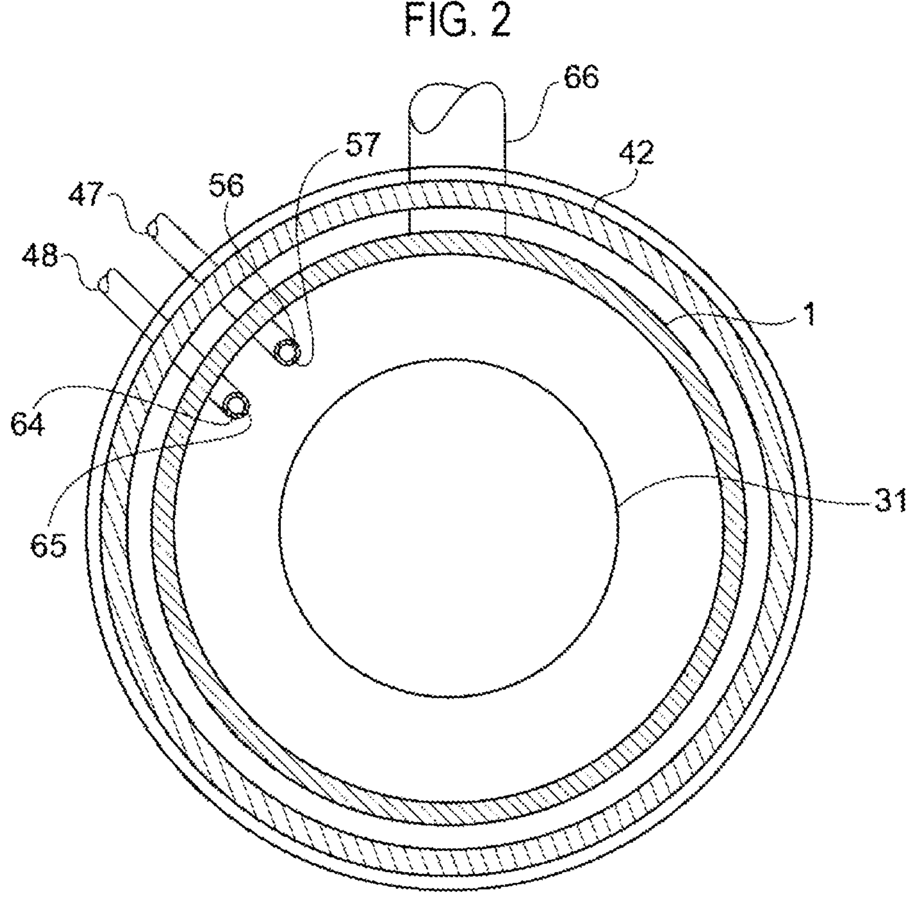
FIG. 2 is a schematic cross-sectional view taken along line A-A in FIG. 1.

FIGS. 1 and 2 show a vertical process furnace 29 used in a substrate processing apparatus which is an example of a processing apparatus according to the present disclosure.

First, an outline of the operation of the substrate processing apparatus according to the present disclosure will be described with reference to FIG. 1.

When a predetermined number of wafers 31 as workpieces are transferred in a boat 32 as a holder, the boat 32 is raised by a boat elevator and is inserted into the process furnace 29. In a state where the boat 32 is completely charged, the process furnace 29 is air-tightly closed by a seal cap 35. In the air-tightly closed process furnace 29, in accordance with a selected process recipe, the wafers 31 are heated, a process gas is supplied into the process furnace 29, and the wafers 31 are processed while the atmosphere of the process chamber 2 is being discharged from a gas exhaust pipe 66 by an exhaust device (not shown).

Next, the process furnace 29 will be described with reference to FIGS. 1 and 2.

A reaction tube 1 is installed inside a heater 42 which is a heating device (heating means), and a manifold 44 is connected consecutively to the lower end of the reaction tube 1, for example, by stainless steel via an O-ring 46 which is an airtight member. The lower end opening (furnace port) of the manifold 44 is air-tightly closed by the seal cap 35 as a lid via an O-ring 18 which is an airtight member. Thus, the process chamber 2 is defined by at least the reaction tube 1, the manifold 44, and the seal cap 35.

The boat 32 is erected over the seal cap 35 via a boat support 45, and the boat support 45 serves as a holder for holding the boat 32.

Two gas supply pipes (a first gas supply pipe 47 and a second gas supply pipe 48) as supply paths for supplying a plurality of types of process gases, here, two types of process gases, are installed in the process chamber 2.

A precursor unit 71, a valve 81, a first mass flow controller (hereinafter also referred to as an MFC) 49, which is a liquid flow rate control device (flow rate control means), a valve 82, a reservoir 51 as a tank, and a valve 52, which is an opening/closing valve, are arranged in the first gas supply pipe 47 in this order from the upstream. A pressure gauge 80 as a pressure sensor and a valve 84 are installed between the valve 82 and the reservoir 51. In particular, a first carrier gas supply pipe 53 for supplying a carrier gas is joined at the downstream side of the valve 52 as a gas supply valve. A carrier gas source 72, a second MFC 54 which is a flow rate control device (flow rate control means), and a valve 55, which is an opening/closing valve, are arranged in the first carrier gas supply pipe 53 in this order from the upstream. Further, a first nozzle 56 extending vertically along the inner wall of the reaction tube 1 is installed at a leading end of the first gas supply pipe 47, and first gas supply holes 57 for supplying a gas are formed in the side of the first nozzle 56. The first gas supply holes 57 are formed at equal pitches in the vertical direction and have the same opening area. A carrier gas (for example, a $N_2$ gas), which is an inert gas supplied from the carrier gas source 72, can be supplied to a supply pipe 47*a* between the precursor unit 71 and the valve 81 via a valve 77 by a supply pipe 76.

Further, in the present embodiments, although not particularly illustrated, a vaporizer is installed. The vaporizer includes the first MFC 49, the reservoir 51 including a tank for storing a liquid precursor, and a heater for heating the liquid precursor. The heater (not shown) is installed in the reservoir 51 and is used to vaporize the liquid precursor. In the present embodiments, the valve 52 is also provided with a valve heater (hereinafter also simply referred to as a heater), which will be described below, as an example of a heating member.

In the description of the present embodiments, in the first gas supply pipe 47, a pipe provided at the upstream side of the reservoir 51 between the reservoir 51 and the precursor unit 71 is referred to as a supply pipe 47*a*. Further, in the first gas supply pipe 47, the downstream side of the reservoir 51 is referred to as a supply pipe 47*b*.

Figure 3:
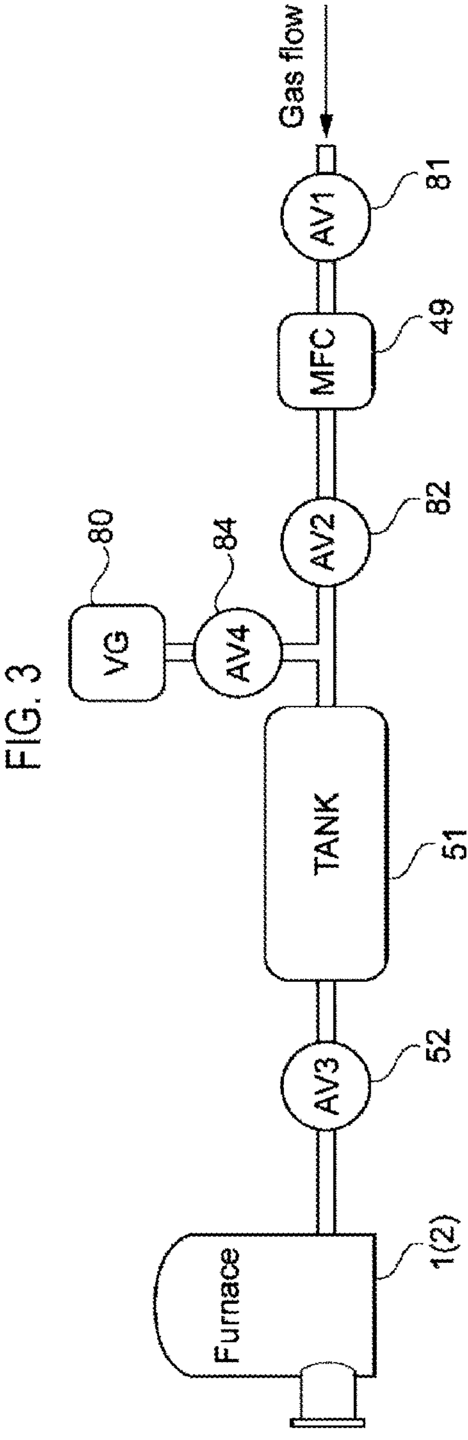
FIG. 3 is a schematic view showing a portion of the substrate processing apparatus according to the present embodiments.

FIG. 3 is an enlarged view of a main part of the supply pipe 47*a* for supplying a dichlorosilane ($SiH_2Cl_2$, abbreviation: DCS) gas. As shown in FIG. 3, the supply pipe 47*a* for supplying the DCS gas is provided with a reservoir 51 as a tank for storing the DCS gas, valves 52, 82 and 84 on the upstream side and the downstream side, and a pressure gauge 80. When flowing the DCS gas in the reservoir 51 into the process furnace 29, since the DCS gas does not flow smoothly if there is an unnecessary pipe, a pressure gauge 80 is attached to the upstream of the reservoir 51 as shown in FIG. 3. Parts of the pressure gauge 80 and the valve 84 will be described below.

Here, the first gas supply pipe 47, the first MFC 49, the reservoir 51, the valve 52, the valve 81 and the valve 82 are collectively referred to as a first gas supplier (first gas supply line). The nozzle 56 may be also included in the first gas supplier. The carrier gas supply pipe 53, the second MFC 54 and the valve 55 may be also included in the first gas supplier. Further, the precursor unit 71 and the carrier gas source 72 may be also included in the first gas supplier.

A reaction gas source 73, a third MFC 58, which is a flow rate control device (flow rate control means), and a valve 59, which is an opening/closing valve, are arranged in the second gas supply pipe 48 in this order from the upstream. A second carrier gas supply pipe 61 for supplying a carrier gas is joined at the downstream side of the valve 59. A carrier gas source 74, a fourth MFC 62, which is a flow rate control device (flow rate control means), and a valve 63, which is an opening/closing valve, are arranged in the second carrier gas supply pipe 61 in this order from the upstream. A second nozzle 64 is installed in parallel to the first nozzle 56 at a leading end of the second gas supply pipe 48, and second gas supply holes 65 for supplying a gas are formed on the side of the second nozzle 64. The second gas supply holes 65 are formed at equal pitches in the vertical direction and have the same opening area.

Here, the second gas supply pipe 48, the third MFC 58, the valve 59 and the nozzle 64 are collectively referred to as a second gas supplier (second gas supply line). The carrier gas supply pipe 61, the fourth MFC 62 and the valve 63 may be also included in the second gas supplier. Further, the reaction gas source 73 and the carrier gas source 74 may be also included in the second gas supplier.

A liquid precursor supplied from the precursor unit 71 joins the first carrier gas supply pipe 53 via the valve 81, the first MFC 49, the valve 82, the reservoir 51, and the valve 52, and is then supplied into the process chamber 2 via the first nozzle 56. The liquid precursor is supplied into the process chamber 2 in a state where it is vaporized by a vaporizer (not shown). A reaction gas supplied from the reaction gas source 73 joins the second carrier gas supply pipe 61 via the third MFC 58 and the valve 59 and is then supplied into the process chamber 2 via the second nozzle 64.

The process chamber 2 is connected to a vacuum pump 68, which is an exhaust device (exhaust means), via a gas exhaust pipe 66 for exhausting a gas and is vacuum-exhausted by the vacuum pump 68. Further, the gas exhaust pipe 66 is provided with a pressure sensor as a furnace pressure gauge and a valve 67 as a pressure control valve. The valve 67 is an opening/closing valve which can be opened/closed for vacuum-exhaust/stop of vacuum-exhaust of the process chamber 2, and the valve 67 is an on-off valve that is adjustable to a predetermined pressure by adjusting the valve opening based on the pressure value detected by the pressure sensor.

A boat rotation mechanism 69 is installed on the seal cap 35. The boat rotation mechanism 69 is configured to rotate the boat 32 to improve processing uniformity.

Figure 4:
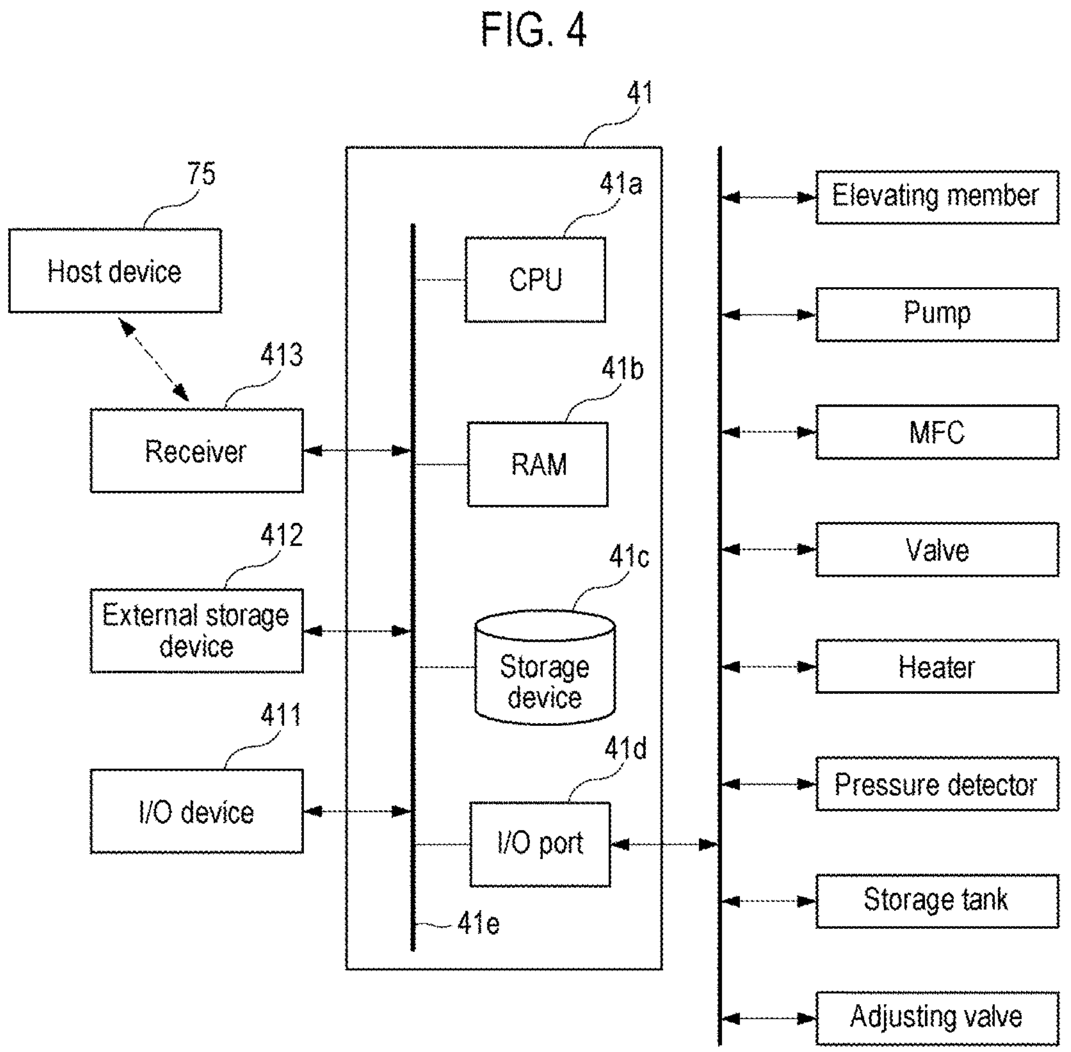
FIG. 4 is a schematic configuration view of a controller of the substrate processing apparatus according to the present embodiments, in which a control system of the controller is shown in a block diagram.

As shown in FIG. 4, the substrate processing apparatus includes a controller 41 that controls the operations of various parts.

The outline of the controller 41 is shown in FIG. 4. The controller 41, which is a control part (control means), is configured as a computer including a central processing unit (CPU) 41*a*, a random access memory (RAM) 41*b*, a storage device 41c, and an I/O port 41d. The RAM 41b, the storage device 41c, and the I/O port 41d are configured to exchange data with the CPU 41a via an internal bus 41e. The controller 41 is configured to be connected to an input/output device 411 configured as a touch panel, for example, and an external storage device 412. Further, a receiver 413 connected to a host device 75 via a network is connected to the controller 41. The receiver 413 can receive information of other devices from the host device 75.

The storage device 41c is configured by, for example, a flash memory, a hard disk drive (HDD), or the like. A control program for controlling the operation of the substrate processing apparatus, a process recipe in which the procedure and condition of substrate processing to be described below are described, a correction recipe, and the like are stored readably in the storage device 41c. The process recipe and the correction recipe are combined to obtain a predetermined result by causing the controller 41 to execute the respective procedures in the substrate-processing process and characteristic-checking process performed in a substrate processing mode, and function as a program. In the present disclosure, the term "program" may include only the process recipe or the correction recipe, only the control program, or both. Further, the RAM 41b is configured as a memory area (work area) in which programs, data, and the like read by the CPU 41a are temporarily held.

The I/O port 41d is connected to an elevating member, a heater, a mass flow controller, a valve, and the like.

The controller 41, which is a control part, performs various controls on flow rate adjustment of the MFC, opening/closing operation of the valve, temperature adjustment of the heater, start-up/stop of the vacuum pump, rotational speed adjustment of the boat rotation mechanism, elevating operation of a boat elevation mechanism, operation of the pressure gauge 80, and the like.

The controller 41 is not limited to the dedicated computer but may be configured as a general-purpose computer. For example, the controller 41 according to the embodiments can be configured by preparing the external storage device 412 (for example, a semiconductor memory such as a USB memory or a memory card) that stores the above-mentioned program and installing the program in a general-purpose computer using the external storage device 412. The means for supplying the program to the computer is not limited to being supplied via the external storage device 412. For example, a communication means such as Internet or a dedicated line may be used to supply the program without going through the external storage device 412. Further, the storage device 41c and the external storage device 412 are configured as a computer-readable recording medium. Hereinafter, these are collectively referred to simply as a recording medium. In the present disclosure, when the term "recording medium" is used, it may include only the storage device 41c, only the external storage device 412, or both.

Next, an example of processing a substrate will be described. Here, as an example of a process of manufacturing a semiconductor device, a cycle process of processing a film by alternately supplying a source (precursor) and a reactant (reaction gas) to a process chamber will be described. In the embodiments, an example will be described in which a silicon nitride film ($Si_3N_4$ film, hereinafter also referred to as a SiN film) is formed on a substrate using a DCS gas as the source and an ammonia ($NH_3$) gas as the reactant. DCS is an example of a liquid precursor.

In a film-forming process in the present embodiments, a SiN film is formed on a wafer 31 by performing a cycle a predetermined number of times (once or more), the cycle including non-simultaneously performing: step 1 of supplying a DCS gas to the wafer 31 of the process chamber 2; step 2 of removing the DCS gas (residual gas) from the process chamber 2; step 3 of supplying an $NH_3$ gas to the wafer 31 of the process chamber 2; and step 4 of removing the $NH_3$ gas (residual gas) from the process chamber 2.

First, as described above, the wafer 31 is charged to the boat 32 which is then loaded into the process chamber 2. At this time, as shown in FIG. 2, the reservoir 51 is connected to the precursor unit 71. After the boat 32 is loaded into the process chamber 2, four steps to be described below are sequentially executed (Step 1)

In step 1, a DCS gas and a carrier gas are flown while the heater 42 is being operated. First, the valves 55, 67, 81, and 82 are opened. The flow rate of the DCS gas is adjusted by the MFC 49 and the DCS gas is supplied from the supply pipe 47a to the reservoir 51 via a pipe. The DCS gas is stored in the tank of the reservoir 51 and is vaporized by a heater (not shown). The vaporized gaseous DCS gas is supplied to the supply pipe 47b by opening the valve 52 and closing the valve 81 and the valve 82. The carrier gas whose flow rate is adjusted by the second MFC 54 is supplied from the first carrier gas supply pipe 53 to the supply pipe 47b and is mixed with the DCS gas in the supply pipe 47b. This mixed gas is exhausted from the gas exhaust pipe 66 while being supplied into the process chamber 2 from the first gas supply holes 57 of the first nozzle 56. Thus, a film containing Si is formed over the wafer 31.

(Step 2)

In step 2, the valve 52 of the first gas supply pipe 47 and the valve 55 of the first carrier gas supply pipe 53 are closed to stop the supply of the DCS gas and the carrier gas. With the valve 67 of the gas exhaust pipe 66 kept open, the process furnace 29 is exhausted to 20 Pa or lower by the vacuum pump 68, and the residual DCS gas is eliminated from the process chamber 2. At this time, if an inert gas, for example, a $N_2$ gas used as a carrier gas, is supplied to the process furnace 29, the effect of eliminating the residual DCS gas is further enhanced.

(Step 3)

In step 3, an $NH_3$ gas and a carrier gas are flown. First, the valve 59 installed in the second gas supply pipe 48 and the valve 63 installed in the second carrier gas supply pipe 61 are both opened to mix the $NH_3$ gas, with its flow rate adjusted by the third MFC 58, supplied from the second gas supply pipe 48, and the carrier gas, with its flow rate adjusted by the fourth MFC 62, supplied from the carrier gas supply pipe 61. This mixed gas is exhausted from the gas exhaust pipe 66 while being supplied from the second gas supply holes 65 of the second nozzle 64 into the process chamber 2. By the supply of the $NH_3$ gas, the film containing Si over the base film of the wafer 31 reacts with the $NH_3$ gas to form a SiN film o the wafer 31.

(Step 4)

In step 4, after the SiN film is formed, the valves 59 and 63 are closed, and the interior of the process chamber 2 is vacuumed-exhausted by the vacuum pump 68 to eliminate the $NH_3$ gas remaining after contributing to film formation. At this time, if an inert gas, for example, a $N_2$ gas used as a carrier gas, is supplied into the process chamber 2, the effect of eliminating the residual $NH_3$ gas from the process chamber 2 is further enhanced.

Further, a SiN film having a predetermined film thickness can be formed over the wafer 31 by repeating one cycle plural times, the one cycle including the above-described steps 1 to 4.

As described above, in the process recipe, with the valves 81, 82 opened and the valves 52, 84 closed, the DCS gas is stored in the tank of the reservoir 51. Thereafter, the valves 81 and 82 are closed and then the valve 52 is opened to flow the DCS gas in the tank of the reservoir 51 into the process chamber 2 of the reaction tube 1. A film is formed by repeating this process for several hundred cycles.

At this time, a Cv value (so-called capacity coefficient) as a characteristic value of the valve 52 affects the flow rate and speed of the DCS gas and consequently the film thickness.

Next, a process of executing a correction recipe for checking the characteristic value (Cv value) of the valve 52 as parts to be managed in the embodiments will be described with reference to FIG. 5. By executing the correction recipe shown in FIG. 5 for each batch, it is possible to check the fluctuation of the Cv value which is the capacity coefficient of the valve 52. Here, the pressure difference is the difference between the primary side (pressure gauge 80) and the secondary side (pressure sensor). However, in the embodiments, since the value of the pressure sensor provided in the gas exhaust pipe 66 is sufficiently small such as several tens Pa, it is set to zero in calculation.

Although a condition of the correction recipe shown in FIG. 5 is different from a condition for actually processing the wafer 31, since the Cv value fluctuates according to a measurement condition, it is necessary to fix a condition for measuring the Cv value. For this reason, as shown in FIG. 1, the pressure gauge 80 is installed at least in the supply pipe 47*a* on the upstream side of the valve 52 (preferably between the valve 52 and the valve 82), the valve 84 for isolating from the precursor gas supplied from the precursor unit 71 is installed, and an inert gas ($N_2$ gas) is supplied from the carrier gas source 72 to the supply pipe 47*a* on the upstream side of the valve 81, as described above. With such a configuration, the correction recipe shown in FIG. 5 can be implemented under predetermined fixed condition.

When the correction recipe shown in FIG. 5 is executed, a predetermined standby state is checked, and the boat 32 is raised by the boat elevator without transferring the wafer 31 and is loaded into the process furnace 29 (boat-loading step). With the boat 32 loaded, the process furnace 29 is air-tightly closed by the seal cap 35. In the air-tightly closed process furnace 29, evacuation and $N_2$ purge are performed as the process recipe (purge step). Then, with the pressure adjusting valve 67 installed in the gas exhaust pipe 66 fully opened, a $N_2$ gas of a constant flow rate is supplied into the process furnace 29, and the pressure value of the pressure gauge 80 is detected. Then, a calculation process is performed by an incorporated program to calculate a Cv value from the detected pressure value. If the Cv value is normal, as well as the process recipe, the internal atmosphere of the process furnace 29 is replaced with $N_2$ at the atmospheric pressure, the boat is unloaded from the process furnace 29, and the process furnace 29 is returned to the standby state (boat-unloading step). Next, each step will be described.

First, in the process of the correction recipe shown in FIG. 5, as a first step, the internal temperature of the reaction tube 1 (the process chamber 2) is set to a temperature in the normal standby state. Then, the valves 55, 81, 82, 52, and 67 are opened to perform the $N_2$ purge. That is, the residual DCS gas is eliminated by supplying a $N_2$ gas, which is an inert gas used as a carrier gas, to the process chamber 2. In short, it is checked whether the process chamber 2 is in the normal standby state.

Next, as a second step, the boat 32 is loaded. This is because it is necessary to read a numerical value of the pressure gauge 80 when a determined $N_2$ gas is flown to a target valve (the valve 52) in a state where the interior of the process chamber 2 is evacuated, in order to measure a Cv value. At this time, the wafer 31 is not placed on the boat 32.

Next, as a third step, with the valves 81, 82, 52, and 84 closed, the process chamber 2 is evacuated by the vacuum pump 68 to evacuate the interior of the process furnace 29. The evacuation may be checked in the same manner as the process recipe. Further, when this step is performed, the valves installed in the second gas supply line as well as the first gas supply line are closed as described above.

Next, as a fourth step, the valves 81, 82, 52, and 84 in the first gas supply line are opened to perform $N_2$ purge. That is, a $N_2$ gas, which is an inert gas used as a carrier gas, is supplied to the process chamber 2. Here, in this step, in order to remove outgassing and particles existing in the process furnace 29, the $N_2$ purge is performed on all lines including the first gas supply line having the reservoir 51.

Next, as a fifth step, the valves 81, 82, 52, 84, and 67 are continuously opened to flow the $N_2$ gas into the first gas supply line after stopping the $N_2$ purge of the other gas supply lines. That is, in order to eliminate the influence of the other gas supply lines, the Cv value is calculated by flowing the $N_2$ gas only to the first gas supply line. By performing the $N_2$ purge for 30 minutes or longer, it is possible to stabilize the temperature of a diaphragm as sheet material inside the valve 52. Then, by stabilizing the temperature of the diaphragm, it is possible to avoid the fluctuation of the Cv value due to expansion/contraction of the diaphragm sensitive to the temperature. At this time, the open/close state of the valve 67 by the controller 41 is fully open.

After the above-described $N_2$ purge is performed for 30 minutes or longer, a calculation process is performed by an incorporated program to calculate a Cv value from a pressure value of the pressure gauge 80. The calculated Cv value is formed to be able to be notified to a worker. Then, the controller 41 compares the calculated Cv value with a reference value or range to determine whether or not it is appropriate.

In the present embodiments, in the fifth step, an appropriate range of Cv value that does not significantly affect the film thickness of a product is set in advance, and this Cv value is stored in the storage device 41*c*. If a measured Cv value deviates from the appropriate range, a warning message indicating that the Cv value deviated from the appropriate range can be displayed on the screen of a liquid crystal display device of the input/output device 411. In addition, if the measured Cv value deviates from the appropriate range, it may be possible to notify the worker of the fact by a notification means such as a warning lamp or a warning sound. In the long-term operation, for example, since the valve Cv value has shifted, notification can be made to urge replacement of the target part (valve). Moreover, since it is possible to change the Cv value by valve temperature, notification can be made to urge valve temperature adjustment.

The flow rate of the $N_2$ gas in the fifth step and the flow rate of the $N_2$ gas in the fourth step are set to be the same. Specifically, for example, in full scale 10 slm of MFC, in consideration of flow rate control stability, setting to 9 slm corresponding to 90% thereof is included. Moreover, it is preferable to set not only the $N_2$ gas flow rate but also the pressure, temperature, and the like under the same condition. As a result, in the fourth step (purge step), there is no need to set a special processing condition, and the fifth step can be started immediately after the fourth step only by closing the valves installed in the other gas supply lines, thereby shortening step processing time.

Furthermore, when the pressure, temperature, flow rate, processing time, etc. in this fifth step are set to be the same as those in the processing step of the process recipe, the Cv value of the valve 52 can be calculated under the process condition close to the process recipe, which is preferable since the reliability of the calculated Cv value can be improved. Thus, in the fifth step, the Cv value can be calculated in a state where the internal pressure of the process chamber 2 is reduced to match the process condition of the process recipe.

In particular, the present embodiments include the step of heating the $N_2$ gas via a valve heater which is a heating member installed in the valve 52. Thus, by using the valve heater, the $N_2$ gas can be kept constant at a certain set temperature, so that the influence of the temperature on the inert gas can be suppressed. Therefore, temperature control of the diaphragm in the valve 52 can be performed simply and appropriately.

Since the condition for measuring the Cv value is fixed in advance, the condition of the step of calculating the Cv value in at least the fifth step is fixed. For example, a $N_2$ gas as gas species, a $N_2$ gas flow rate, pressure, temperature, and the like are preset. In addition, when the Cv value is measured, for example, if a valve which is the target part is heated, it is necessary to heat the other valves similarly.

Next, as a sixth step, the internal pressure of the process chamber 2 is returned to the atmospheric pressure.

The third step, the fourth step, and the sixth step are steps required to evacuate the process chamber 2.

Next, as a seventh step, as the boat-unloading step of the process recipe, the lower part of the process chamber 2 is opened and the boat 32 is unloaded from the process chamber 2.

Next, as an eighth step, the process chamber 2 is returned to the normal standby state. This is the end of the process of processing the correction recipe.

As described above, the process of executing the correction recipe includes a step of supplying a predetermined amount of $N_2$ gas to a gas supply line provided with the valve 52, with the valve 67 for adjusting the internal pressure of the process furnace 29 fully opened, a step of detecting a pressure value of the gas supply line while supplying the $N_2$ gas, and a step of calculating a Cv value based on the detected pressure value.

According to the present embodiments, if the calculated Cv value is out of the appropriate range, the worker can immediately check whether or not there is an abnormality in the settings of temperature, flow rate, processing time, and the like in the processing process. When there is no abnormality in each setting condition, the worker can consider repair, replacement, or the like of the valve which is the target part for which the Cv value is measured. As a result, it is possible to prevent the occurrence of Cv value deviation due to long-term operation and external factors and hence the occurrence of product lot-out due to film thickness fluctuation.

By executing the process of the correction recipe for checking the Cv value of the valve 52 as shown in FIG. 5 for each batch, it is possible to check the fluctuation of the Cv value of the valve 52. Although the correction recipe may be carried out each time the process recipe is executed once, there is also a trade-off with productivity, so it is not limited to such frequency. For example, the correction recipe may be carried out each time the process recipe is executed a predetermined number of times (one or more times) to know the fluctuation of the Cv value of the valve 52 accompanying the execution of the process recipe. In addition, it is also possible to operate the correction recipe every predetermined cycle, such as once a week or once a month, thereby knowing the fluctuation of the Cv value of the valve 52 at a predetermined cycle.

The correction recipe in the present embodiments is executed, for example, after maintenance such as replacement of each element, member, etc. of the process furnace 29 as shown in FIG. 3. In particular, by executing the correction recipe after the replacement of the valve 52 which is the target parts for which the Cv value is to be measured, it is possible to know the fluctuation of the Cv value of the valve 52 accompanying the parts replacement.

From such a point of view, the present embodiments are also a method of managing parts since the Cv value of the target parts is managed. When the valve 52, which is a supply valve, is replaced with a new one, by executing the correction recipe after replacing the valve 52, the Cv value of the new valve 52 can be known before the new valve 52 is used.

It is also possible to execute the correction recipe after the maintenance work of the valve heater which is the heating member. Thereby, the fluctuation of the Cv value of the valve 52 can be known corresponding to the valve heater after the maintenance work.

Furthermore, in the present embodiments, the process condition of the process recipe can be changed, and the correction recipe can be executed after the process condition of the process recipe is changed. Thereby, the fluctuation of the Cv value of the valve 52 can be known corresponding to the process recipe before and after the change of the process condition.

In addition, the correction recipe is executed, for example, to be incorporated into a maintenance recipe for the process furnace 29. This maintenance recipe is a recipe for performing maintenance work such as inspection, stabilization of operation, and initialization for the whole or each element of the process furnace 29, and also includes a recipe (purge recipe) for purging the process furnace 29. The clear difference between the correction recipe and the purge recipe is that step 5 in the correction recipe is not in the purge recipe. Therefore, when incorporating the correction recipe into the purge recipe, it is only necessary to add this step 5. By incorporating the correction recipe into the maintenance recipe (including the purge recipe), it is not necessary to create a new recipe especially as the correction recipe, and the correction recipe can be executed utilizing the existing recipe.

The purge recipe is executed, for example, as a particle countermeasure for the process furnace 29. As one example, the purge recipe is performed after executing the process recipe a predetermined number of times or after maintenance. When the correction recipe, which is a recipe for checking the Cv value of the valve 52, is incorporated into this purge recipe, the correction recipe can be simultaneously executed at the timing of executing the purge recipe. Since the Cv value of the valve 52 can be checked by the correction recipe each time the purge recipe is executed, for example, it is possible to suppress the deviation of the Cv value due to the change with time. In this manner, the correction recipe is executed before the Cv value deviation (for example, the substrate film thickness abnormality) occurs rather than after the Cv value deviation occurs.

The bar graph of FIG. 6 is an example of the check result of a Cv value by an experiment at a temperature measurement position as shown in FIG. 7.

Figures 6A, 6B:
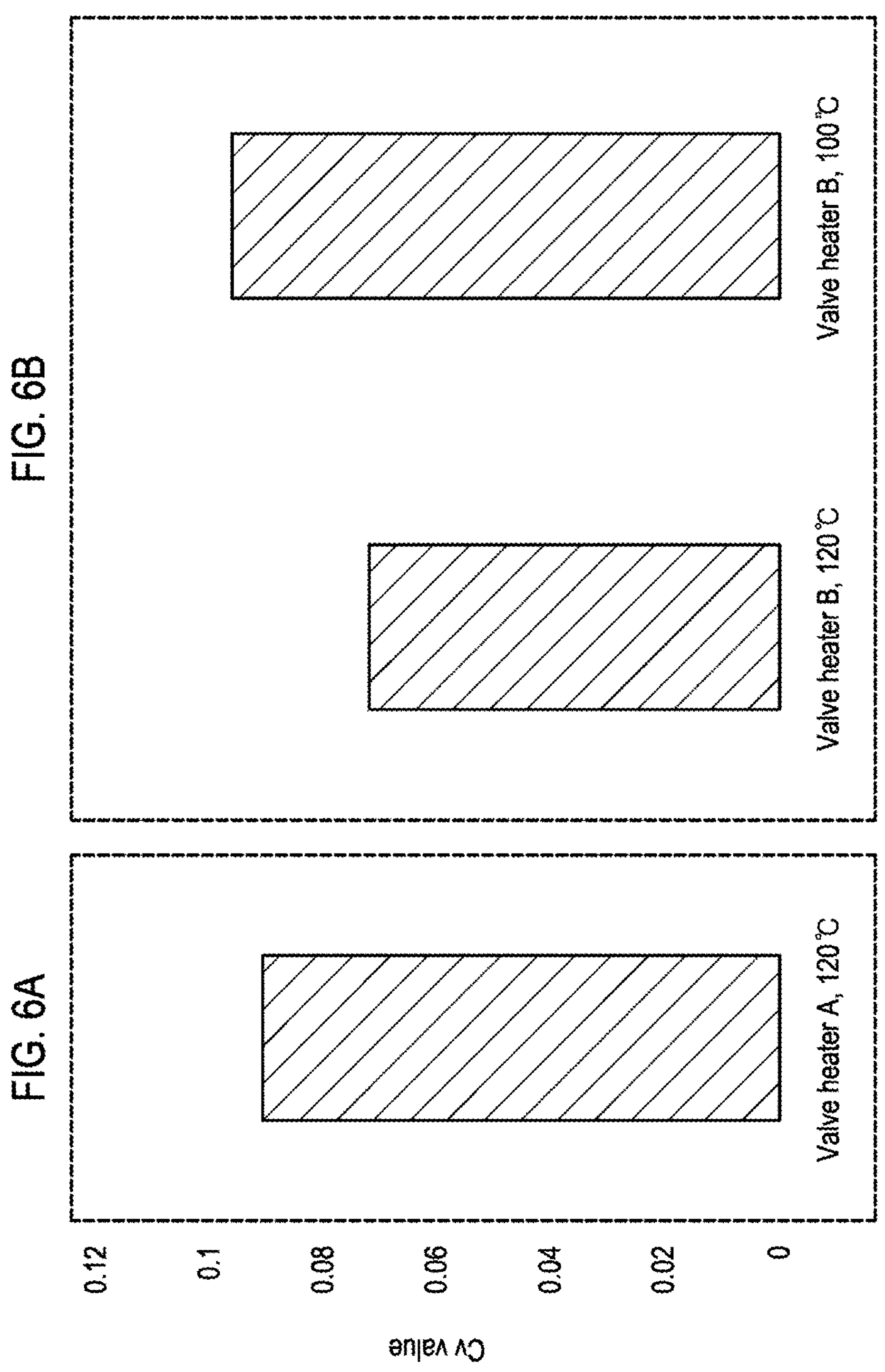
FIG. 6 shows an example of the check result of the Cv value according to the present embodiments, FIG. 6A being an explanatory view showing an example of the check result of a Cv value of a valve heater A, and FIG. 6B being an explanatory view showing an example of the check result of a Cv value of a valve heater B.
Figure 7A:
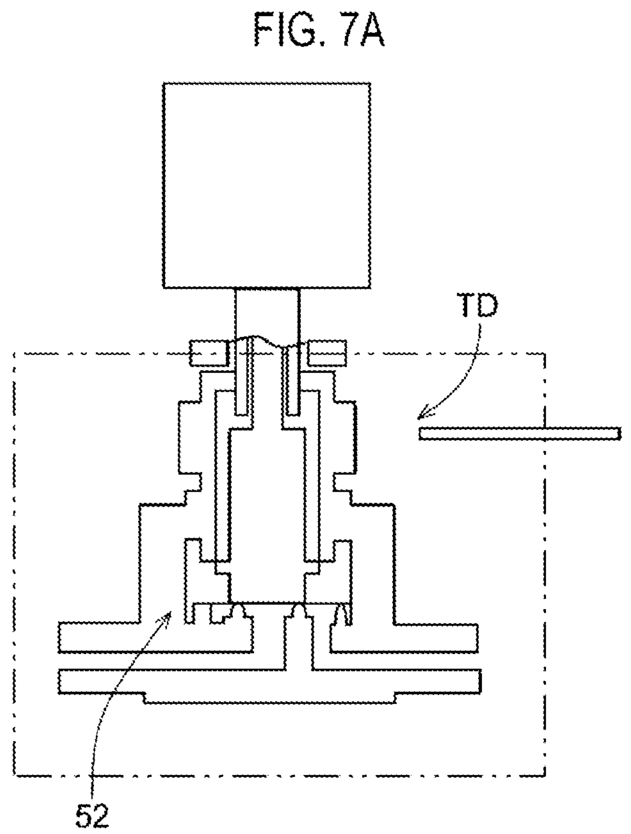
FIG. 7 is a schematic explanatory view showing Cv value checking according to the present embodiments, FIG. 7A being a longitudinal sectional view of a valve heater A in which the temperature measurement position is set to a position away from the valve, and FIG. 7B being a longitudinal sectional view of a valve heater B in which the temperature measurement position is set to a position inside the valve.
Figure 7B:
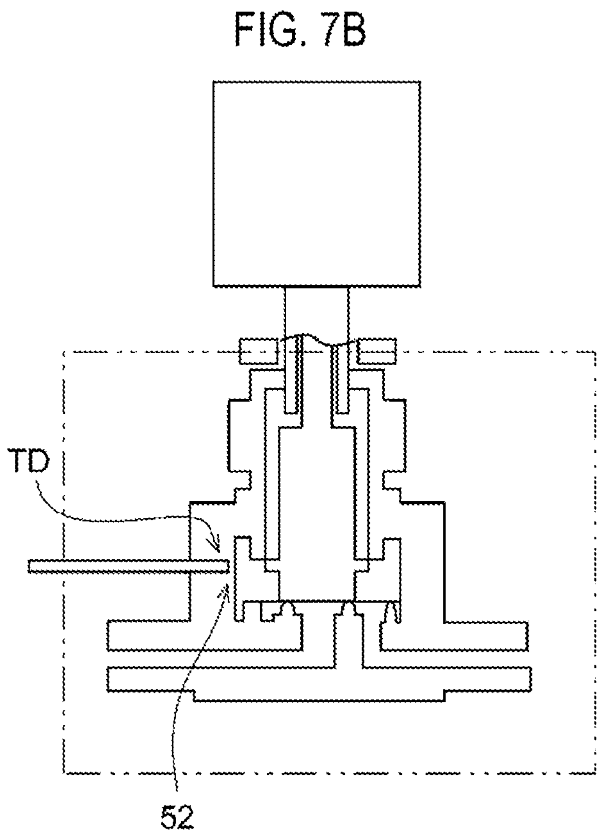

FIG. 7 is a view showing that a heating area of a valve heater is indicated by a two-dot chain line, and for the same valve 52, a temperature measurement position TD by a temperature sensor of the valve heater is different between FIG. 7A and FIG. 7B. That is, FIG. 7A shows that the temperature measurement position TD by the temperature sensor of the valve heater is a position away from the valve 52, and FIG. 7B shows that the temperature of the valve 52 is directly measured. In FIG. 7B showing that the temperature of the valve 52 is directly measured, the Cv value is checked for two temperatures of the valve 52, 100 degrees C. and 120 degrees C. In FIG. 7A, the temperature of the valve is fixed at 120 degrees C. The bar graph of FIG. 6A corresponds to FIG. 7A, and the two bar graphs of FIG. 6B respectively correspond to the two temperatures of the valve 52 in FIG. 7B.

From FIGS. 6A and 6B, it can be seen that there is a difference in Cv value by changing the temperature measurement position of the valve heater. Further, it can be understood from the comparison between the two bar graphs in FIG. 6B that there is a difference in Cv value even when the temperature setting of the valve heater is changed. That is, it can be seen that there is a difference in Cv values due to such a slight condition difference.

Figure 8:
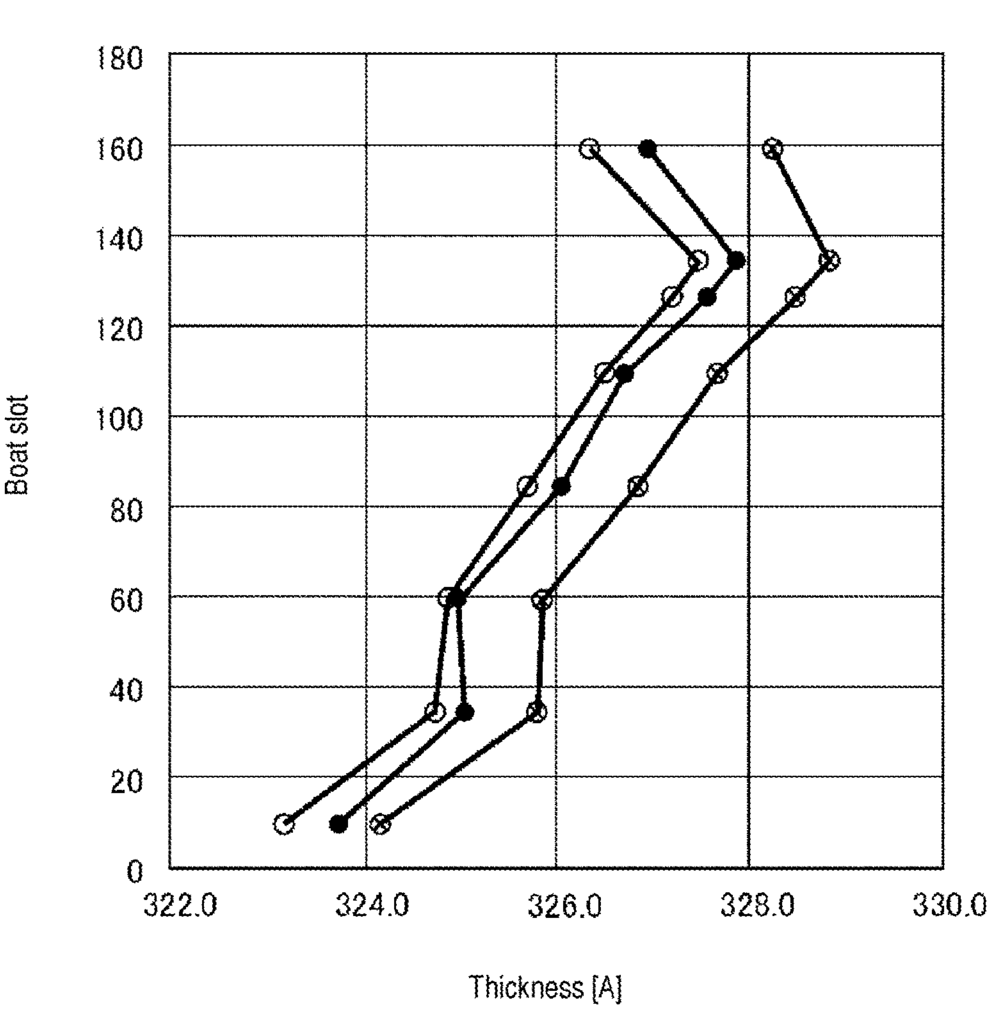
FIG. 8 is an explanatory view in which film thickness data in the check result of FIG. 7 are displayed with a line graph.

FIG. 8 is a graph of film thickness data in the temperature setting shown in FIG. 7A and the two temperature settings shown FIG. 7B. The horizontal axis in FIG. 8 represents an average value of film thickness values (unit: angstrom) measured at a plurality of predetermined locations in the plane of the wafer 31 processed under the conditions shown in FIGS. 7A and 7B. The vertical axis in FIG. 8 represents a monitor position in the transfer direction (vertical direction) of a predetermined number of wafers 31 held on the boat 32, in which "180" of a boat slot indicates a position of the upper end of a substrate-holding area that holds the wafers 31 of the boat 32 and "0" of the boat slot indicates a position of the lower end of the same substrate-holding area.

The lowest Cv value in FIGS. 6A and 6B is a case of valve heater B at 120 degrees C. In this case, it can be seen from FIG. 8 that the film thickness is the smallest at any monitor position. The highest Cv value in FIGS. 6A and 6B is a case of valve heater B at 100 degrees C. In this case, it can be seen from FIG. 8 that the film thickness is the largest at any monitor position. In this way, a minute Cv value difference as shown in FIG. 6 affects the film thickness. That is, even a slight condition difference causes a fluctuation of Cv value, and this fluctuation of Cv value affects the film thickness. Therefore, as the present embodiments, it can be understood that checking of the Cv value by the correction recipe is important and effective.

As the present embodiments, since the Cv value can be checked by executing the correction recipe each time the process recipe is executed a predetermined number of times (one or more times), the fluctuation of film thickness due to the deviation of the Cv value can be predicted in advance, thereby preventing product lot-out due to the fluctuation of Cv value.

Further, according to the present embodiments, it is possible to prevent product lot-out due to deviation of Cv value by long-term operation or external factors.

Other Embodiments of the Present Disclosure

Although the embodiments of the present disclosure have been concretely described above, the present disclosure is not limited to the above-described embodiments but various modifications can be made without departing from the spirit and scope of the present disclosure.

In the above-described embodiments, a gas source for $N_2$ purge in the correction recipe shown in FIG. 5 is the carrier gas source 72. However, this $N_2$ purge gas source may be the carrier gas source 74 or may be separately provided. In addition, the empty boat 32 is used in the correction recipe shown in FIG. 5. However, a dummy substrate may be loaded into the boat slot of the boat as the case of processing the product substrate. In addition, the heating member (heater) is provided in the valve 52 and the reservoir 51. However, the heating member (heater) may be provided in the entire first gas supply line or may be provided in at least the valve 52, the reservoir 51, and the first gas supply pipe 47 downstream of the reservoir 51. Further, in the above-described embodiments, the target part is the valve 52, but the present disclosure is not limited thereto. The target parts may be any valve provided in the first gas supply line and may be any valve for supply/stop of a gas contributing to a process by an opening/closing operation.

Furthermore, when the calculated Cv value is out of the appropriate range, the temperature setting of the valve may be changed so that the Cv value is within the appropriate range, and the above-mentioned fifth step may be repeatedly executed.

For example, as a film-forming process performed by the substrate processing apparatus, a case where the DCS gas is used as a source (liquid source), the $NH_3$ gas is used as a reactant (reaction gas), and a SiN film is formed over the wafer by alternately supplying these gases has been illustrated in the above-described embodiments. However, the present disclosure is not limited thereto. That is, any liquid precursor may be used as the source and any gas that reacts with the source to perform film processing may be used as the reactant to form other types of thin films. Furthermore, even when three or more types of process gases are used, the present disclosure can be applied as long as a film-forming process is performed by alternately supplying these gases.

Further, for example, it has been illustrated in the above-described embodiments that a process performed by the substrate processing apparatus is the film-forming process in a semiconductor device. However, the present disclosure is not limited thereto. That is, the process may be a process of forming an oxide film or a nitride film or a process of forming a film containing metal, other than the film-forming process. Further, the specific contents of the substrate processing are unquestioned and can be suitably applied not only to the film-forming process but also to other substrate processing such as annealing, oxidizing, nitriding, diffusion, lithography, and so on.

Furthermore, the present disclosure can be suitably applied to other substrate processing apparatuses such as an annealing apparatus, an oxidizing apparatus, a nitriding apparatus, an exposure apparatus, a coating apparatus, a drying apparatus, a heating apparatus, a processing apparatus using plasma, etc., or combinations thereof. Further, in the present disclosure, these devices may be mixed.

In addition, for example, a semiconductor-manufacturing process has been illustrated in the above-described embodiments. However, the present disclosure is not limited thereto. For example, the embodiments may be used for a liquid precursor tank and an intermediate storage tank for storing a liquid requiring high cleanliness of liquid in the chemical industry field, a liquid tank incorporated in a vaporizer, etc. The liquid in the chemical industry referred to here is, for example, pure water, hydrogen peroxide water, ammonia water, alcohols, organic acids, etc.

Further, part of the configuration of some embodiments can be replaced with the configuration of other embodiments, and the configuration of some embodiments can be added to the configuration of other embodiments. Moreover, it is also possible to add, delete, and replace other configurations for part of the configurations of the respective embodiments.

Further, an example of using a $N_2$ gas as the inert gas has been illustrated in the above embodiments. However, the present disclosure is not limited thereto. For example, the inert gas may be a rare gas such as an Ar gas, a He gas, a Ne gas, a Xe gas, etc., in which case a rare gas source is required. Furthermore, it is necessary to connect this rare gas source to the first gas supply pipe 47 so that the rare gas can be introduced from the valve 81.

According to the present disclosure in some embodiments, it is possible to prevent the occurrence of product lot-out due to fluctuation of the characteristic value of a valve by long-term operation or external factors.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:

a process chamber in which a substrate is processed;

a supply valve configured to supply a process gas into the process chamber;

a sensor configured to detect a pressure value in a slupply pipe provided with the supply valve;

a boat configured to hold the substrate; and a controller configured to be capable of executing a process, before processing the substrate by supplying the process gas into the process chamber according to a process recipe, the process comprising:

(a) loading the boat into the process chamber in a state where the boat does not hold the substrate;

(b) supplying an inert gas into the process chamber for a predetermined period of time by opening the supply valve;

(c) detecting the pressure value in the supply pipe by the sensor while supplying the inert gas;

(d) calculating a characteristic value of the supply valve based on the detected pressure value;

(e) determining whether the calculated characteristic value falls within a predetermined range; and (f) in response to determining that the calculated characteristic value falls within the predetermined range, unloading the boat from the process chamber.

2. The substrate processing apparatus of claim 1, further comprising an adjusting valve installed at an exhaust portion of the process chamber and configured to adjust a pressure of the process chamber, wherein the controller is configured to be capable of executing the act of (b) in a state where the adjusting valve is opened.

3. The substrate processing apparatus of claim 1, wherein the controller is configured to be capable of setting at least one selected from the group of pressure, temperature, flow rate, and processing time in the act of (b) to be the same as a process condition in the act of processing the substrate.

4. The substrate processing apparatus of claim 1, wherein the process further comprises (g) purging the process chamber by opening the supply valve before the act of (b), and wherein the controller is configured to set at least one selected from the group of pressure, temperature, flow rate, and processing time in the act of (b) and the act of (g) to be the same as each other.

5. The substrate processing apparatus of claim 1, further comprising a heater provided at the supply valve, wherein, in the act of (b), the controller is configured to be capable of heating the inert gas by the heater.

6. The substrate processing apparatus of claim 5, wherein the controller is configured to be capable of executing the act of (d) and the act of (b) in parallel.

7. The substrate processing apparatus of claim 5, wherein the act of (b) comprises maintaining a temperature of the supply valve when the characteristic value of the supply valve is previously calculated.

8. The substrate processing apparatus of claim 5, wherein the act of (d) is executed after maintenance operation of the heater.

9. The substrate processing apparatus of claim 1, further comprising an adjusting valve installed at an exhaust portion of the process chamber and configured to adjust a pressure of the process chamber, wherein the controller is configured to be capable of executing the act of (b) or the act of (c) in a state where the adjusting valve is fully opened.

10. The substrate processing apparatus of claim 1, wherein the controller is configured to be capable of executing the act of (d) before the process recipe is executed.

11. The substrate processing apparatus of claim 10, wherein the controller is configured to be capable of executing the act of (d) each time the process recipe is executed one or more times.

12. The substrate processing apparatus of claim 10, wherein the act of (d) is executed after a process condition of the process recipe is changed.

13. The substrate processing apparatus of claim 10, wherein a condition in the act of (b) is the same as at least one selected from the group of pressure, temperature, and processing time of the process recipe.

14. The substrate processing apparatus of claim 1, wherein the controller is configured to be capable of executing a correction recipe to execute calculating of the characteristic value of the supply valve, and wherein the correction recipe is configured to be executable in a state where the substrate is not placed in the process chamber.

15. The substrate processing apparatus of claim 1, wherein the controller is configured to be capable of executing a correction recipe to execute calculating of the characteristic value of the supply valve, and wherein the correction recipe includes the act of (b), the act of (c), and the act of (d).

16. A method of adjusting parts comprising a process, before processing a substrate by supplying a process gas into a process chamber according to a process recipe, the process comprising:

(a) loading a boat into the process chamber in a state where the boat does not hold the substrate;

(b) supplying an inert gas into the process chamber for a predetermined period of time by opening a supply valve;

(c) detecting a pressure value in the supply pipe by a sensor while supplying the inert gas;

(d) calculating a characteristic value of the supply valve based on the detected pressure value;

(e) determining whether the calculated characteristic value falls within a predetermined range; and (f) in response to determining that the calculated characteristic value deviates from falls within the predetermined range, unloading the boat from the process chamber.

17. The method of claim 16, further comprising processing the substrate by supplying the process gas into the process chamber using the parts adjusted by the act of (b) to the act of (d).

18. The method of claim 16, further comprising processing the substrate including a semiconductor device by supplying the process gas into the process chamber using the parts adjusted by the act of (b) to the act of (d).

19. A non-transitory computer-readable recording medium storing a program that causes, by a computer, a substrate processing apparatus to execute a process, before processing a substrate by supplying a process gas into a process chamber according to a process recipe, the process comprising:

(a) loading a boat into the process chamber in a state where the boat does not hold the substrate;

(b) supplying an inert gas into the process chamber for a predetermined period of time by opening a supply valve;

(c) detecting a pressure value in the supply pipe by a sensor while supplying the inert gas;

(d) calculating a characteristic value of the supply valve based on the detected pressure value;

(e) determining whether the calculated characteristic value falls within a predetermined range; and (f) in response to determining that the calculated characteristic value falls within the predetermined range, unloading the boat from the process chamber.

* * * * *